US012346647B2

(12) United States Patent
Wang

(10) Patent No.: US 12,346,647 B2
(45) Date of Patent: Jul. 1, 2025

(54) MEMORY ARRAY CIRCUIT, MEMORY ARRAY LAYOUT AND VERIFICATION METHOD

(71) Applicant: CHANGXIN MEMORY TECHNOLOGIES, INC., Hefei (CN)

(72) Inventor: Peihuan Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 711 days.

(21) Appl. No.: 17/659,337

(22) Filed: Apr. 15, 2022

(65) Prior Publication Data

US 2023/0050097 A1 Feb. 16, 2023

(30) Foreign Application Priority Data

Aug. 16, 2021 (CN) ........................ 202110937301.7

(51) Int. Cl.

| | |
|---|---|
| ***G06F 30/398*** | (2020.01) |
| ***G06F 30/392*** | (2020.01) |
| ***G11C 11/408*** | (2006.01) |
| ***G11C 11/4094*** | (2006.01) |

(52) U.S. Cl.

CPC .......... *G06F 30/398* (2020.01); *G06F 30/392* (2020.01); *G11C 11/4085* (2013.01); *G11C 11/4094* (2013.01)

(58) Field of Classification Search

CPC . G06F 30/398; G06F 30/392; G11C 11/4085; G11C 11/4094

USPC .......................................................... 716/111

See application file for complete search history.

(56) References Cited

U.S. PATENT DOCUMENTS

| | | | | |
|---|---|---|---|---|
| 2004/0073745 A1* | 4/2004 | Ma | G11C 8/12 | 711/105 |
| 2023/0089590 A1* | 3/2023 | Chang | G11C 17/16 | 716/119 |

FOREIGN PATENT DOCUMENTS

| | | | | |
|---|---|---|---|---|
| CN | 108595825 A | | 9/2018 | |
| CN | 111565288 B | * | 8/2021 | H04N 5/3742 |
| EP | 0422347 A2 | * | 4/1991 | |
| EP | 0580467 A2 | * | 1/1994 | |
| EP | 2387039 A1 | * | 11/2011 | G11C 11/419 |
| KR | 100191790 B1 | * | 6/1990 | |

* cited by examiner

*Primary Examiner* — Suresh Memula

(74) *Attorney, Agent, or Firm* — Syncoda LLC; Feng Ma

(57) ABSTRACT

Embodiments of the present application provide a memory array circuit, a memory array layout and a verification method. The memory array circuit includes: M word lines (WLs); M WL break nodes, each being configured to separate a corresponding one of the WLs into a first WL pin and a second WL pin; N bit lines (BLs); and N BL break nodes, each being configured to separate a corresponding one of the BLs into a first BL pin and a second BL pin, wherein the M and the N each are a positive even number.

14 Claims, 2 Drawing Sheets

MEMORY ARRAY CIRCUIT, MEMORY ARRAY LAYOUT AND VERIFICATION METHOD

CROSS-REFERENCE TO RELATED APPLICATIONS

This application claims the priority of Chinese Patent Application No. 202110937301.7, submitted to the Chinese Intellectual Property Office on Aug. 16, 2021, the disclosure of which is incorporated herein in its entirety by reference.

TECHNICAL FIELD

Embodiments of the present application relate to the field of semiconductors, and in particular to a memory array circuit, a memory array layout and a verification method.

BACKGROUND

As a commonly used semiconductor memory in computers, a dynamic random access memory (DRAM) is composed of many repeated memory cells. Each memory cell typically includes a capacitor and a transistor. In the transistor, the gate is connected to the word line (WL), the drain is connected to the bit line (BL), and the source is connected to the capacitor. The voltage signal on the WL controls the transistor to turn on or off, and then the data information stored in the capacitor is read through the BL, or data information is written into the capacitor through the BL for storage.

There are a plurality of WLs and BLs in the memory, with a layout of WLs and BLs being crucial to performance of the memory. However, in order to verify whether the layout of WLs and BLs meets requirements, existing methods cannot effectively perform layout versus schematic (LVS) consistency verification on the WLs and BLs.

SUMMARY

According to an aspect, an embodiment of the present application provides a memory array circuit, including: M WLs; M WL break nodes, each being configured to separate a corresponding one of the WLs into a first WL pin and a second WL pin; N BLs; and N BL break nodes, each being configured to separate a corresponding one of the BLs into a first BL pin and a second BL pin, wherein the M and the N each are a positive even number.

According to another aspect, an embodiment of the present application further provides a memory array layout, including: M spaced WL layers; N spaced BL layers; M WL break identification layers, each being configured to separate a corresponding one of the WL layers into two WL sub-layers independent of each other along an extension direction of the WL layers; and N BL break identification layers, each being configured to separate a corresponding one of the BL layers into two BL sub-layers independent of each other along an extension direction of the BL layers, wherein the M and the N each are a positive even number.

According to still another aspect, an embodiment of the present application further provides an LVS consistency verification method, including: providing the memory array circuit according to the above embodiment; establishing the memory array layout corresponding to the memory array circuit according to the above embodiment; and performing LVS consistency verification on the memory array circuit and the memory array layout.

BRIEF DESCRIPTION OF THE DRAWINGS

One or more embodiments are exemplified by corresponding accompanying drawings, and these exemplified descriptions do not constitute a limitation on the embodiments. The accompanying drawings are not limited by scale unless otherwise specified.

DETAILED DESCRIPTION

A memory array includes a plurality of spaced WLs and a plurality of spaced BLs. The WLs are electrically connected to corresponding WL driving circuits. The BLs are electrically connected to corresponding sense amplifier circuits. In case of an error in a layout of the WLs or the BLs, electrical connections in the memory array will be affected. Therefore, verification on layouts of WL layers and BL layers in the memory array layout can improve the yield of the memory array.

An embodiment of the present application is to provide a memory array layout, which is used to verify layouts of BL layers and WL layers.

In order to make the objectives, technical solutions and advantages of the embodiments of the present application clearer, the embodiments of the present application are described below with reference to the accompanying drawings. Those of ordinary skill in the art should understand that many technical details are proposed in each embodiment of the present application to help the reader better understand the present application. However, even without these technical details and various changes and modifications made based on the following embodiments, the technical solutions claimed in the present application may still be realized.

Figure 1:
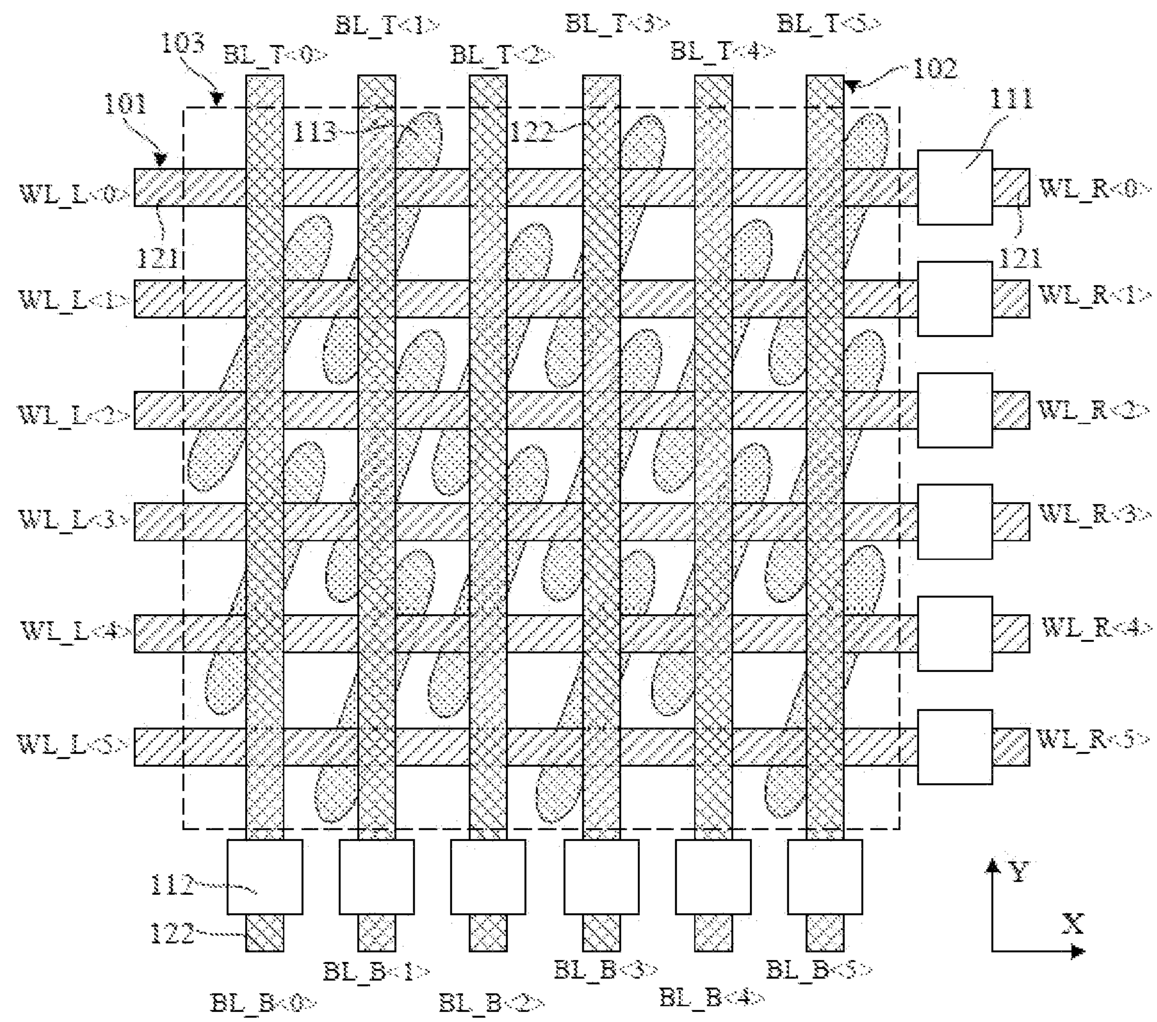
FIG. 1 is a schematic structural diagram of a memory array layout according to an embodiment of the present application.

FIG. 1 is a schematic structural diagram of a memory array layout according to an embodiment of the present application.

Referring to FIG. 1, the memory array layout includes: M spaced WL layers 101; N spaced BL layers 102; M WL break identification layers 111, each being configured to separate a corresponding one of the WL layers 101 into two WL sub-layers 121 independent of each other along an extension direction of the WL layers 101; and N BL break identification layers 112, each being configured to separate a corresponding one of BL layers 102 into two BL sub-layers 122 independent of each other along an extension direction of the BL layers 102, wherein the M and the N each are a positive even number.

The memory array layout provided by the embodiment of the present application will be described in more detail below with reference to the drawings.

The WL layers 101 define WLs in the memory device, while the BL layers 102 define BLs in the memory device. The WL layers 101 extend along a first direction X, and the BL layers 102 extend along a second direction Y. In some embodiments, the first direction X may be perpendicular to the second direction Y. The M may be a positive even number greater than or equal to 2, and the N may be a positive even number greater than or equal to 2.

The memory array layout may further include: a plurality of first WL driving circuits (not shown) on sides of the WL layers 101, and a plurality of second WL driving circuits (not shown) on the other sides of the WL layers 101. The first WL driving circuits and the second WL driving circuits are parallel to the first direction X.

Specifically, at least one of the WL layers 101 is connected to the first WL driving circuits, and remaining WL layers 101 are connected to the second WL driving circuits. For example, by tagging the M WL layers 101 from 0 to M according to an arrangement order, WL layers 101 tagged as odd numbers are electrically connected to the first WL driving circuits, and WL layers 101 tagged as even numbers are electrically connected to the second WL driving circuits. Terminals of the WL layers 101 close to the first WL driving circuits are defined as left terminals, and terminals of the WL layers 101 close to the second WL driving circuits are defined as right terminals. If an actual extension direction of the WL layers 101 is deviated from the first direction X, same WL layers 101 are electrically connected to the first WL driving circuits and the second WL driving circuits at the same time.

On a same one of the WL layers 101, the WL sub-layer 121 on one side of the WL break identification layer 111 and the WL sub-layer 121 on the other side may be tagged, respectively. A WL sub-layer 121 on a side of each of the WL break identification layers 111 is provided with a first tag, and a WL sub-layer 121 on the other side of each of the WL break identification layers 111 is provided with a second tag. On the same one of the WL layers 101, a first tag corresponds to a second tag. Two terminals of the WL layers 101 can be respectively tagged through the WL break identification layers 111, namely corresponding left WL sub-layers 121 and corresponding right WL sub-layers 121 on the WL layers 101 can be respectively tagged. If an order of left tags differs from that of right tags, the error in layouts of the WL layers 101 can be found timely and the position of the actual error WL layer 101 can further be located.

With six WL layers 101 as an example in FIG. 1, first tags of corresponding left WL sub-layers 121 of the WL layers 101 may be sequentially WL_L<0>, WL_L<1>, WL_L<2>, WL_L<3>, WL_L<4> and WL_L<5>, and second tags of the corresponding right WL sub-layers 121 of the WL layers 101 may be sequentially WL_R<0>, WL_R<1>, WL_R<2>, WL_R<3>, WL_R<4> and WL_R<5>.

The memory array layout may further include: a plurality of first sense amplifier circuits (not shown) on sides of the BL layers 102, and a plurality of second sense amplifier circuits (not shown) on the other sides of the BL layers 102. The first sense amplifier circuits and the second sense amplifier circuits are parallel to the second direction Y.

Specifically, at least one of the BL layers 102 is connected to the first sense amplifier circuits, and remaining BL layers 102 are connected to the second sense amplifier circuits. For example, by tagging the N BL layers 102 from 0 to N according to an arrangement order, BL layers 102 tagged as odd numbers are electrically connected to the first sense amplifier circuits, and BL layers 120 tagged as even numbers are electrically connected to the second sense amplifier circuits. Terminals of the BL layers 102 close to the first sense amplifier circuits are defined as upper terminals, and terminals of the BL layers 102 close to the second sense amplifier circuits are defined as lower terminals. If an actual extension direction of the BL layers 102 is deviated from the second direction Y, same BL layers 102 are electrically connected to the first sense amplifier circuits and the second sense amplifier circuits at the same time.

On a same one of the BL layers 102, the BL sub-layer 122 on one side of the BL break identification layer 112 and the BL sub-layer 122 on the other side may be tagged, respectively. A BL sub-layers 122 on a side of each of the BL break identification layers 112 is provided with a third tag, and a BL sub-layer 122 on the other side of each of the BL break identification layer 112 is provided with a fourth tag. On the same one of the BL layers 102, a third tag corresponds to a fourth tag. Two terminals of the BL layers 102 can be respectively tagged through the BL break identification layers 112, namely corresponding upper BL sub-layers 122 and corresponding lower BL sub-layers 122 on the BL layers 102 can be respectively tagged. If an order of upper tags differs from that of lower tags, the error in layouts of the BL layers 102 can be found timely and the position of the actual error BL layer 102 can further be located.

With six BL layers 102 as an example in FIG. 1, third tags of corresponding upper BL sub-layers 122 of the BL layers 102 are sequentially BL_T<0>, BL_T<1>, BL_T<2>, BL_T<3>, BL_T<4> and BL_T<5>, and fourth tags of the corresponding lower BL sub-layers 122 of the BL layers 102 are sequentially BL_B<0>, BL_B<1>, BL_B<2>, BL_B<3>, BL_B<4> and BL_B<5>.

In some embodiments, an arrangement direction of the M WL break identification layers 111 may be perpendicular to the extension direction of the WL layers 101. Small spacings are provided between adjacent WL break identification layers 111 to minimize the space of all WL break identification layers 111. In addition, with the small spacings between the adjacent WL break identification layers 111, the time required to identify all WL break identification layers 111 in the LVS consistency verification is shortened, and the efficiency of the LVS consistency verification is improved. In other embodiments, the M WL break identification layers 111 may also be staggered and spaced, namely all WL break identification layers 111 may be unnecessarily arranged along the same direction.

In some embodiments, the WL break identification layers 111 each may be of a rectangular shape, and in a direction perpendicular to the extension direction of the WL layers 101, the WL break identification layers 111 may be wider than the WL layers 101. In other embodiments, the WL break identification layers 111 each may be of a circular shape, a trapezoidal shape or an irregular shape.

An arrangement direction of N BL break identification layers 112 may be perpendicular to the extension direction of the BL layers 102. Small spacings are provided between adjacent BL break identification layers 112 to minimize the space of all BL break identification layers 112. In addition, with the small spacings between the adjacent BL break identification layers 112, the time required to identify all BL break identification layers 112 in the LVS consistency verification is shortened, and the efficiency of the LVS consistency verification is improved. In other embodiments, the N BL break identification layers 112 may also be staggered and spaced, namely all BL break identification layers 112 may be unnecessarily arranged along the same direction.

In some embodiments, the BL break identification layers 112 each may be of a rectangular shape, and in a direction perpendicular to the extension direction of the BL layers 102, the BL break identification layers 112 may be wider than the BL layers 102. In other embodiments, the BL break identification layers 112 each may be of a circular shape, a trapezoidal shape or an irregular shape.

The memory array layout may further include: an active layer array 103. The active layer array 103 includes a plurality of spaced active layers 113. The WL break identification layers 111 are located at a periphery of the active layer array 103. The BL break identification layers 112 are located at the periphery of the active layer array 103. The active layers 113 define an active region of the memory device. The active layers 113 extend along a third direction different from the first direction X and the second direction Y.

In some embodiments, the M WL break identification layers 111 may be located at a same side of the active layer array 103, and the N BL break identification layers 112 may also be located at a same side of the active layer array 103. Compared with the solution wherein the WL break identification layers are provided on two opposite sides of the active layer array, the case wherein all WL break identification layers 111 are located at the same side of the active layer array 103 can shorten the WL layers 101 and minimize the space of the memory array layout. Compared with the solution wherein the BL break identification layers are provided on two opposite sides of the active layer array, the case wherein all BL break identification layers 112 are located at the same side of the active layer array 103 can shorten the BL layers 102 and minimize the space of the memory array layout.

It is to be understood that there may also be the WL break identification layers 111 on the two opposite sides of the active layer array 103, and the BL break identification layers 112 on the two opposite sides of the active layer array 103 in other embodiments.

In the above embodiment, the WL layers 101 are correspondingly provided with the WL break identification layers 111, and the BL layers 102 are correspondingly provided with the BL break identification layers 112 in the memory array layout. With the memory array layout, the LVS consistency verification can be performed on layouts of a plurality of WL layers 101 and on layouts of a plurality of BL layers 102.

Accordingly, an embodiment of the present application further provides a memory array circuit, which corresponds to the memory array layout in the above embodiment. The memory array circuit provided by the embodiment of the present application will be described below with reference to the drawings.

Figure 2:
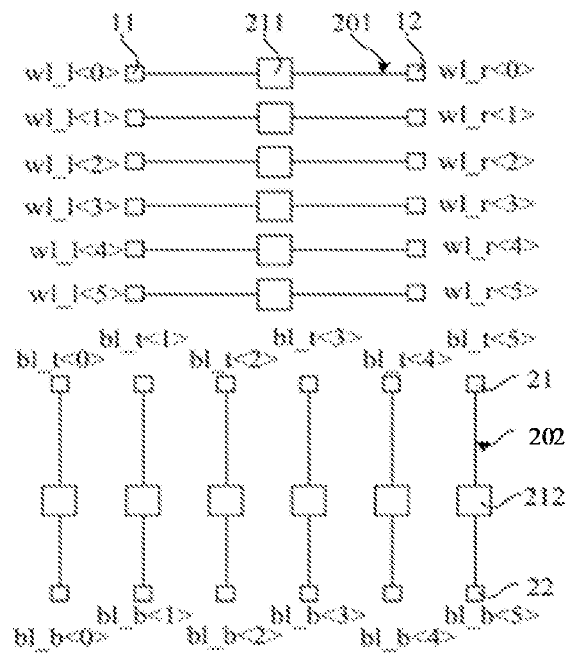
FIG. 2 is a schematic structural diagram of a memory array circuit according to an embodiment of the present application.

FIG. 2 is a schematic structural diagram of a memory array circuit according to an embodiment of the present application.

Referring to FIG. 2, the memory array circuit includes: M WLs 201; M WL break nodes 211, each being configured to separate a corresponding one of the WLs 201 into a first WL pin 11 and a second WL pin 12; N BLs 202; and N BL break nodes 212, each being configured to separate a corresponding one of the BLs 202 into a first BL pin 21 and a second BL pin 22, wherein the M and the N each are a positive even number.

The memory array circuit may be configured to perform the LVS consistency verification on the memory array layout provided in the above embodiment.

Specifically, the first WL pin 11 and the second WL pin 12 each are provided with an identification tag.

For the WLs 201, with M=6 as an example, first WL pins 11 located at same sides of the WL break nodes 211 are sequentially tagged as wl_l<0>, wl_l<1>, wl_l<2>, wl_l<3>l wl_l<4> and wl_l<5>, and second WL pins 12 located at the other sides of the WL break nodes 211 are sequentially tagged as wl_r<0>, wl_r<1>, wl_r<2>, wl_r<3>, wl_r<4> and wl_r<5>. It is to be understood that there are no limits made on the tagging methods of the first WL pins 11 and the second WL pins 12, provided that tags of first WL pins 11 and tags of second WL pins 12 on same WLs 201 are in one-to-one correspondence, namely whether the first WL pins 11 and the second WL pins 12 belong to same WLs 201 can be determined according to the tags of the first WL pins 11 and tags of the second WL pins 12.

For the BLs 202, with M=6 as an example, first BL pins 21 located at same sides of the BL break nodes 212 are sequentially tagged as bl_t<0>, bl_t<1>, bl_t<2>, bl_t<3>, bl_t<4> and bl_t</5>, and second BL pins 22 located at the other sides of the BL break nodes 212 are sequentially tagged as bl_b<0>, bl_b<1>, bl_b<2>, bl_b<3>, bl_b<4> and bl_b</5>. It is to be understood that there are no limits made on the tagging methods of the first BL pins 21 and the second BL pins 22, provided that tags of first BL pins 21 and tags of second BL pins 22 on same BLs 202 are in one-to-one correspondence, namely whether the first BL pins 21 and the second BL pins 22 belong to same BLs 202 can be determined according to the tags of the first BL pins 21 and tags of the second BL pins 22.

The memory array circuit provided in the above embodiment can be applied to consistency verification on layouts of the WL layers and the BL layers.

Accordingly, an embodiment of the present application further provides an LVS verification method, which may be implemented with the memory array circuit and the memory array layout in the above embodiments. The verification method provided by the embodiment of the present application will be described in more detail with reference to drawings.

Figure 3:
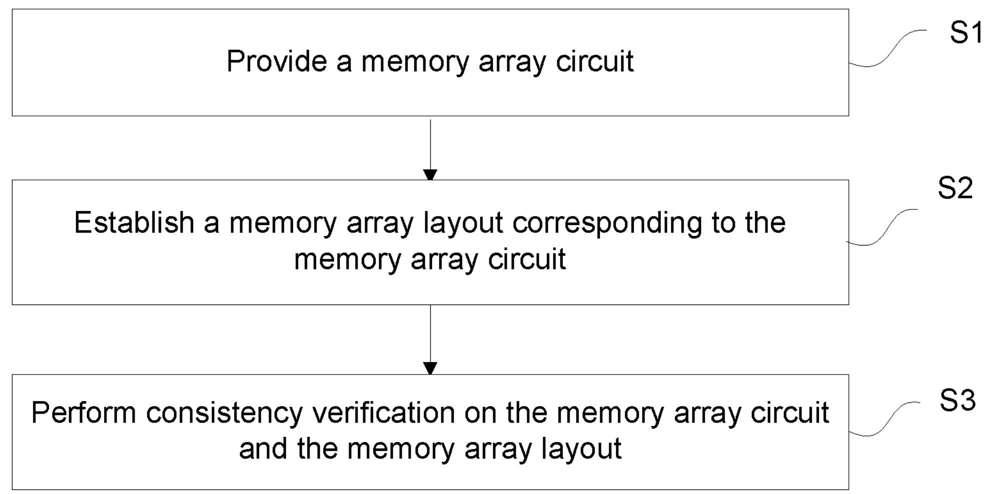
FIG. 3 is a schematic flowchart of a verification method according to an embodiment of the present application.

FIG. 3 is a schematic flowchart of a verification method according to an embodiment of the present application.

Referring to FIG. 2 and FIG. 3, Step S1: Provide a memory array circuit.

Specific descriptions on the memory array circuit may refer to the above embodiment, and will not be repeated herein.

Referring to FIG. 1 and FIG. 3, Step S2: Establish a memory array layout corresponding to the memory array circuit.

Specific descriptions on the memory array layout may refer to the above embodiment, and will not be repeated herein.

Referring to FIG. 3, Step S3: Perform consistency verification on the memory array circuit and the memory array layout.

Specifically, referring to FIG. 1 and FIG. 2, the step of performing consistency verification on the memory array circuit and the memory array layout may include: Identify the WL break identification layers 111, and perform consistency verification on WL layers 101 corresponding to identified WL break identification layers 111 and the memory array circuit; and identify the BL break identification layers 112, and perform consistency verification on BL layers 102 corresponding to identified BL break identification layers 112 and the memory array circuit.

The WL break identification layers 111 each separate a corresponding one of the WL layers 101 into two WL sub-layers 121. If the layout of the WL layer 101 is desirable, one WL sub-layer 121 of the WL layer 101 corresponds to a first WL pin 11 of the WL 201, and the other WL sub-layer 121 of the WL layer 101 corresponds to a second WL pin 12 of the WL 201. If the two WL sub-layers 121 of the WL layer 101 correspond to the first WL pin 11/the second WL pin 12 of a different WL 201 during the consistency verification, there is an error in the layout of the WL layer 101.

The BL break identification layer 112 each separate a corresponding one of the BL layers 102 into two BL sub-layers 122. If the layout of the BL layer 102 is desirable, one BL sub-layer 122 of the BL layer 102 corresponds to a third BL pin 21 of the BL 202, and the other BL sub-layer 122 of the BL layer 102 corresponds to a fourth BL pin 22 of the BL 202. If the two BL sub-layers 122 of the BL layer 102 correspond to the third BL pin 21/the fourth BL pin 22 of a different BL 202 during the consistency verification, there is an error in the layout of the BL layer 102.

In some embodiments, as shown in FIG. 1 and FIG. 2, a WL sub-layer 121 on a side of each of the WL break identification layers 111 is provided with a first tag, a WL sub-layer 121 on the other side of each of the WL break identification layers 111 is provided with a second tag, and on a same one of the WL layers 101, the first tag corresponds to the second tag; and the step of performing the consistency verification on WL layers 101 corresponding to identified WL break identification layers 111 and the memory array circuit includes: Sequentially acquire first tags of a plurality of the WL sub-layers 121 on sides of the WL break identification layers 111, and second tags of a plurality of the WL sub-layers 121 on the other sides of the WL break identification layers 111 according to an arrangement order of the WL layers 101; compare whether an order of all first tags is consistent with an order of a plurality of the first WL pins 11; and compare whether an order of all second tags is consistent with an order of a plurality of the second WL pins 12.

For example, with six WL layers 101 as an example, if first tags have an order of WL_L<0>, WL_L<1>, WL_L<2>, WL_L<3>, WL_L<5> and WL_L<4>, and a plurality of first WL pins 11 have an order of wl_l<0>, wl_l<1>, wl_l<2>, wl_l<3>, wl_l<4> and wl_l<5>, the order of the first tags differs from that of the first WL pins 11. With the consistency verification, the layout of the WL layer 101 corresponding to the problematic first tag has an error. If second tags have an order of WL_R<0>, WL_R<1>, WL_R<3>, WL_R<2>, WL_R<4> and WL_R<5>, and a plurality of second WL pins 12 have an order of wl_l<0>, wl_l<1>, wl_l<2>, wl_l<3>, wl_l<4> and wl_l<5>, the order of the second tags differs from that of the second WL pins 12. With the consistency verification, the layout of the WL layer 101 corresponding to the problematic second tag has an error. If the consistency verification turns out that the first tags have the order of WL_L<0>, WL_L<1>, WL_L<2>, WL_L<3>, WL_L<4> and WL_L<5>, the second tags have the order of WL_R<0>, WL_R<1>, WL_R<2>, WL_R<3>, WL_R<4> and WL_R<5>, the first WL pins 11 have the order of wl_l<0>, wl_l<1>, wl_l<2>, wl_l<3>, wl_l<4> and wl_l<5>, and the second WL pins 12 have the order of wl_r<0>, wl_r<1>, wl_r<2>, wl_r<3>, wl_r<4> and wl_r<5>, layouts of all WL layers 101 are correct.

A BL sub-layer 122 on a side of each of the BL break identification layers 112 is provided with a third tag, a BL sub-layer 122 on the other side of each of the BL break identification layers 112 is provided with a fourth tag, and on a same one of the BL layers 102, the third tag corresponds to the fourth tag; and the step of performing the consistency verification on BL layers 102 corresponding to identified BL break identification layers 112 and the memory array circuit includes: Sequentially acquire third tags of a plurality of the BL sub-layers 122 on sides of the BL break identification layers 112, and fourth tags of a plurality of the BL sub-layers 122 on the other sides of the BL break identification layers 112 according to an arrangement order of the BL layers 102; compare whether an order of all third tags is consistent with an order of a plurality of the first BL pins 21; and compare whether an order of all fourth tags is consistent with an order of a plurality of the second BL pins 22.

For example, with six BL layers 102 as an example, if third tags have an order of BL_T<0>, BL_T<2>, BL_T<1>, BL_T<3>, BL_T<4> and BL_T<5>, and a plurality of first BL pins 21 have an order of bl_t<0>, bl_t<1>, bl_t<2>, bl_t<3>, bl_t<4> and bl_t</5>, the order of the third tags differs from that of the first BL pins 21. With the consistency verification, the layout of the BL layer 102 corresponding to the problematic third tag has an error. If fourth tags have an order of BL_B<0>, BL_B<1>, BL_B<3>, BL_B<2>, BL_B<4> and BL_B<5>, and a plurality of second BL pins 22 have an order of bl_b<0>, bl_b<1>, bl_b<2>, bl_b<3>, bl_b<4> and bl_b</5>, the order of the fourth tags differs from that of the second BL pins 22. With the consistency verification, the layout of the BL layer 102 corresponding to the problematic second tag has an error. If the consistency verification turns out that the third tags have the order of BL_T<0>, BL_T<1>, BL_T<2>, BL_T<3>, BL_T<4> and BL_T<5>, the fourth tags have the order of BL_B<0>, BL_B<1>, BL_B<2>, BL_B<3>, BL_B<4> and BL_B<5>, the first BL pins 21 have the order of bl_t<0>, bl_t<1>, bl_t<2>, bl_t<3>, bl_t<4> and bl_t</5>, and the second BL pins 22 have the order of bl_b<0>, bl_b<1>, bl_b<2>, bl_b<3>, bl_b<4> and bl_b</5>, layouts of all BL layers 102 are correct.

According to the technical solutions for the consistency verification in the embodiment of the present application, the layouts of the WL layers 101 and the BL layers 102 are verified easily to check whether the layouts of the WL layers 101 and the BL layers 102 are correct, and timely find the position of the error WL layer 101 or BL layer 102. In the context of billions of WLs and BLs in the DRAM chip, it is of great significance to perform the efficient LVS verification on layouts of the WLs and BLs.

Those of ordinary skill in the art can understand that the above implementations are specific embodiments for implementing the present application. In practical applications, various changes may be made to the above embodiments in terms of form and details without departing from the spirit and scope of the present application. Those skilled in the art may make changes and modifications to the embodiments without departing from the spirit and scope of the present application. Therefore, the protection scope of the present application should be subject to the scope defined by the claims.

The invention claimed is:

1. A memory array circuit, comprising:
- M word lines;
- M word line break nodes, each being configured to separate a corresponding one of the word lines into a first word line pin and a second word line pin;
- N bit lines; and
- N bit line break nodes, each being configured to separate a corresponding one of the bit lines into a first bit line pin and a second bit line pin, wherein the M and the N each are a positive even number.

2. A memory array layout, comprising:
- M spaced word line layers;
- N spaced bit line layers;
- M word line break identification layers, each being configured to separate a corresponding one of the word line layers into two word line sub-layers independent of each other along an extension direction of the word line layers; and N bit line break identification layers, each being configured to separate a corresponding one of the bit line layers into two bit line sub-layers independent of each other along an extension direction of the bit line layers, wherein the M and the N each are a positive even number.

3. The memory array layout according to claim 2, wherein an arrangement direction of the M word line break identification layers is perpendicular to the extension direction of the word line layers.

4. The memory array layout according to claim 2, wherein the word line break identification layers each are of a rectangular shape, and in a direction perpendicular to the extension direction of the word line layers, widths of the word line break identification layers are greater than widths of the word line layers.

5. The memory array layout according to claim 2, wherein an arrangement direction of the N bit line break identification layers is perpendicular to the extension direction of the bit line layers.

6. The memory array layout according to claim 2, wherein the bit line break identification layers each are of a rectangular shape, and in a direction perpendicular to the extension direction of the bit line layers, widths of the bit line break identification layers are greater than widths of the bit line layers.

7. The memory array layout according to claim 2, further comprising: an active layer array, comprising a plurality of spaced active layers, wherein the word line break identification layers are located at a periphery of the active layer array, and the bit line break identification layers are located at the periphery of the active layer array.

8. The memory array layout according to claim 7, wherein the M word line break identification layers are located at a same side of the active layer array; and the N bit line break identification layers are located at a same side of the active layer array.

9. The memory array layout according to claim 3, wherein the word line break identification layers each are of a rectangular shape, and in a direction perpendicular to the extension direction of the word line layers, widths of the word line break identification layers are greater than widths of the word line layers.

10. The memory array layout according to claim 5, wherein the bit line break identification layers each are of a rectangular shape, and in a direction perpendicular to the extension direction of the bit line layers, widths of the bit line break identification layers are greater than widths of the bit line layers.

11. A layout versus schematic consistency verification method, comprising:

providing a memory array circuit, comprising:

M word lines;

M word line break nodes, each being configured to separate a corresponding one of the word lines into a first word line pin and a second word line pin;

N bit lines; and

N bit line break nodes, each being configured to separate a corresponding one of the bit lines into a first bit line pin and a second bit line pin, wherein the M and the N each are a positive even number;

establishing a memory array layout, corresponding to the memory array circuit, comprising:

M spaced word line layers;

N spaced bit line layers;

M word line break identification layers, each being configured to separate a corresponding one of the word line layers into two word line sub-layers independent of each other along an extension direction of the word line layers; and N bit line break identification layers, each being configured to separate a corresponding one of the bit line layers into two bit line sub-layers independent of each other along an extension direction of the bit line layers, wherein the M and the N each are a positive even number; and performing consistency verification on the memory array circuit and the memory array layout.

12. The layout versus schematic consistency verification method according to claim 11, wherein the performing consistency verification on the memory array circuit and the memory array layout comprises:

identifying the word line break identification layers, and performing the consistency verification on word line layers corresponding to identified word line break identification layers and the memory array circuit; and identifying the bit line break identification layers, and performing the consistency verification on bit line layers corresponding to identified bit line break identification layers and the memory array circuit.

13. The layout versus schematic consistency verification method according to claim 12, wherein a word line sub-layer on one side of each of the word line break identification layers is provided with a first tag, a word line sub-layer on the other side of each of the word line break identification layers is provided with a second tag, and on a same one of the word line layers, the first tag corresponds to the second tag; and the performing the consistency verification on word line layers corresponding to identified word line break identification layers and the memory array circuit comprises:

sequentially acquiring first tags of a plurality of the word line sub-layers on sides of the word line break identification layers, and second tags of a plurality of the word line sub-layers on the other sides of the word line break identification layers according to an arrangement order of the word line layers;

comparing whether an order of all first tags is consistent with an order of a plurality of the first word line pins; and comparing whether an order of all second tags is consistent with an order of a plurality of the second word line pins.

14. The layout versus schematic consistency verification method according to claim 12, wherein a bit line sub-layer on one side of each of the bit line break identification layers is provided with a third tag, a bit line sub-layer on the other side of each of the bit line break identification layers is provided with a fourth tag, and on a same one of the bit line layers, the third tag corresponds to the fourth tag; and the performing the consistency verification on bit line layers corresponding to identified bit line break identification layers and the memory array circuit comprises:

sequentially acquiring third tags of a plurality of the bit line sub-layers on sides of the bit line break identification layers, and fourth tags of a plurality of the bit line sub-layers on the other sides of the bit line break identification layers according to an arrangement order of the bit line layers;

comparing whether an order of all third tags is consistent with an order of a plurality of the first bit line pins; and comparing whether an order of all fourth tags is consistent with an order of a plurality of the second bit line pins.

* * * * *